United States Patent
Lee et al.

(10) Patent No.: US 7,306,964 B2
(45) Date of Patent: Dec. 11, 2007

(54) METHOD OF MANUFACTURING A VERTICALLY-STRUCTURED GAN-BASED LIGHT EMITTING DIODE

(75) Inventors: Jae Hoon Lee, Suwon (KR); Hee Seok Choi, Seoul (KR); Jeong Tak Oh, Suwon (KR); Su Yeol Lee, Seongnam (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/430,990

(22) Filed: May 10, 2006

(65) Prior Publication Data
US 2006/0273341 A1 Dec. 7, 2006

(30) Foreign Application Priority Data
May 10, 2005 (KR) ...................... 10-2005-0039076

(51) Int. Cl.
*H01L 21/00* (2006.01)
(52) U.S. Cl. .......................................... 438/48; 257/97
(58) Field of Classification Search ............... 438/22, 438/406, 455, 458, 29, 46–48, 974; 257/13, 257/79, 87, 101, 102, 97, 103, 90, E21.133
See application file for complete search history.

(56) References Cited

U.S. PATENT DOCUMENTS

| 5,779,924 | A | 7/1998 | Krames et al. |
| 6,794,276 | B2* | 9/2004 | Letertre et al. ............. 438/506 |
| 6,831,302 | B2 | 12/2004 | Erchak et al. |
| 2003/0222263 | A1* | 12/2003 | Choi ........................... 257/79 |

* cited by examiner

*Primary Examiner*—David Vu
(74) *Attorney, Agent, or Firm*—McDermott Will & Emery LLP (57) ABSTRACT

The present invention relates to a method of manufacturing a vertically-structured GaN-based light emitting diode. The method of manufacturing a vertically-structured GaN-based light emitting diode includes forming a GaN layer on a substrate; patterning the compound layer in a predetermined shape; forming an n-type GaN layer on the patterned compound layer through the epitaxial lateral over-growth process and sequentially forming an active layer and a p-type GaN layer on the n-type GaN layer; forming a structure supporting layer on the p-type GaN layer; sequentially removing the substrate and the GaN layer formed on the substrate after forming the structure supporting layer; removing the patterned compound layer exposed after removing the GaN layer so as to form an n-type GaN layer patterned in a concave shape; and forming an n-type electrode on the n-type GaN layer patterned in a concave shape.

13 Claims, 8 Drawing Sheets

DRAWINGS

[FIG. 1] PRIOR ART

$N_1 \sin\theta_1 = N_2 \sin\theta_2$

METHOD OF MANUFACTURING A VERTICALLY-STRUCTURED GAN-BASED LIGHT EMITTING DIODE

CROSS-REFERENCE TO RELATED APPLICATIONS

The application claims the benefit of Korea Patent Application No. 2005-0039076 filed with the Korea Industrial Property Office on May 10, 2005, the disclosure of which is incorporated herein by reference.

BACKGROUND OF THE INVENTION

1. Field of the Invention

The present invention relates to a vertically-structured GaN-based light emitting diode and a method of manufacturing the same, and more specifically, to a vertically-structured GaN-based light emitting diode, in which uniform patterns are formed on the upper surface of an n-type GaN layer by utilizing an epitaxial lateral over-growth (ELOG) process so as to increase the external emission efficiency of photon, and a method of manufacturing the same.

2. Description of the Related Art

In general, a GaN-based light emitting diode is grown on a sapphire substrate. However, the sapphire substrate is solid and nonconductive and has low heat conductivity. Therefore, there is a limitation for reducing the size of a GaN-based light emitting diode so as to reduce a manufacturing cost or improving light output and characteristics of chips. Particularly, since a high current must be applied for high output of a light emitting diode, it is important to deal with the heat emission of the light emitting diode. In order to solve the problems, a vertically-structured GaN-based light emitting diode has been proposed, in which a laser lift-off (LLO) technique is used.

In such a vertically-structured GaN-based light emitting diode according to the related art, however, the external quantum efficiency decreases, the external quantum efficiency meaning the ratio of the number of photons emitted outside a light emitting diode to the number of photons generated in a active layer.

Figure 1:
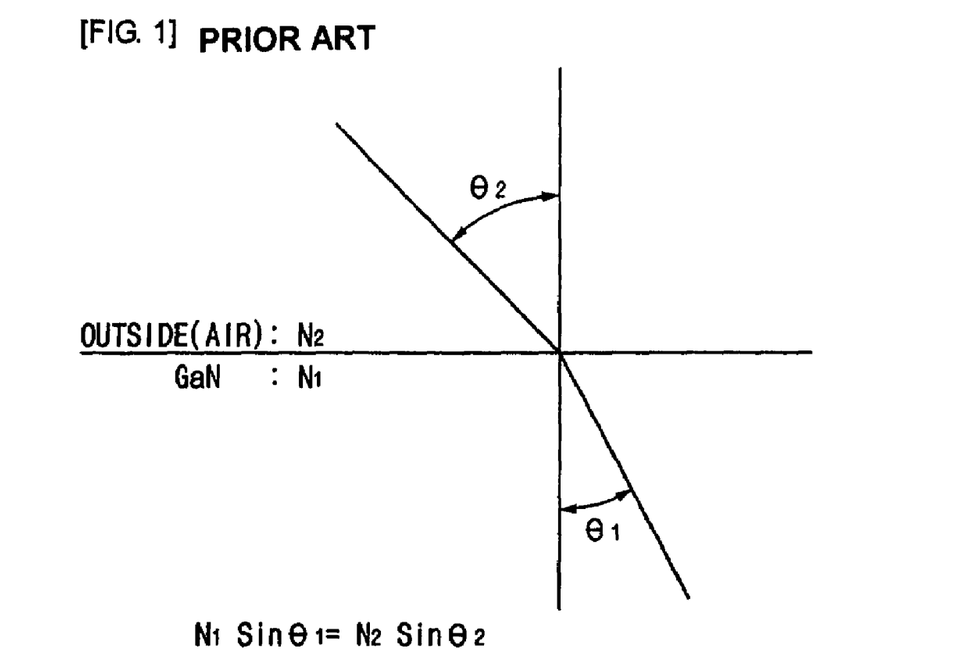
FIG. 1 is a diagram for explaining problems in the related art.

FIG. 1 is a diagram for explaining such problems in detail. Referring to FIG. 1, such problems will be described as follows. In order that the photons generated in the active layer pass through a GaN layer having a larger refractive index $N_1$ than a refractive index $N_2$ of the air so as to escape into the air, the incident angle $\theta_1$ of the photons incident on the air from the GaN layer should be less than a critical angle $\theta_c$.

In this case, the critical angle $\theta_c$ when an escape angle $\theta_2$ where the photons escape into the air is 90° is defined by $\theta_c = \sin^{-1}(N_2/N_1)$. When light is transmitted into the air, whose refractive index is 1, from the GaN layer, the critical angle becomes about 23.6°.

If the incident angle $\theta_1$ is more than or equal to the critical angle $\theta_c$, the photons are totally reflected in the interface between the GaN layer and the air so as to be trapped inside the light emitting diode. As a result, the external quantum efficiency decreases.

In order to prevent the decrease in external quantum efficiency, US Patent Application Publication No. 20030222263 has disclosed a technique in which a patterned array of hemispherical structures is formed on the surface of an n-type GaN layer so that the incident angle $\theta_1$ of the photons incident on the air from the GaN layer becomes less than the critical angle $\theta_c$.

Now, a method of manufacturing the vertically-structured GaN-based light emitting diode disclosed in US Patent Application Publication No. 20030222263 will be described.

Figure 2A:
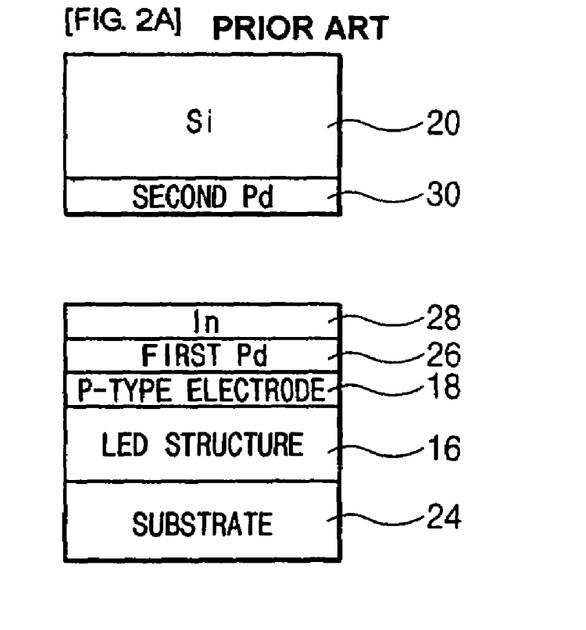
FIGS. 2A to 2C are cross-sectional process views illustrating a vertically-structured GaN-based light emitting diode disclosed in US Patent Application Publication No. 20030222263.
Figure 2B:
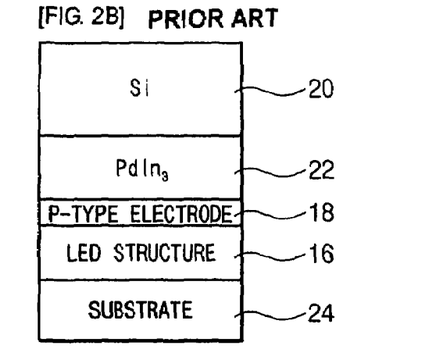
Figure 2C:
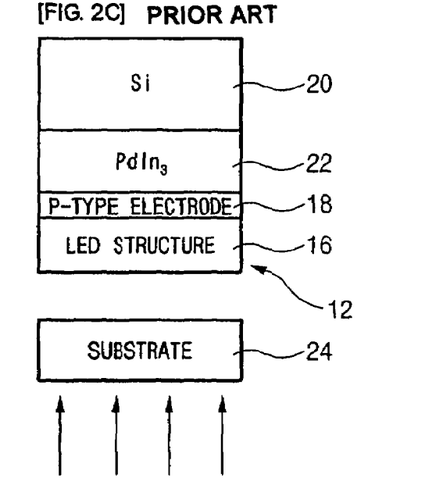
Figure 3A:
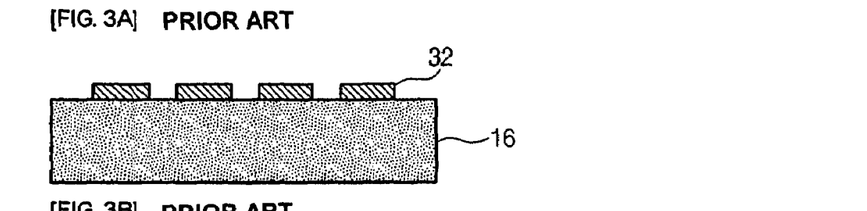
FIGS. 3A to 3C are enlarged cross-sectional process views illustrating the vertically-structured GaN-based light emitting diode disclosed in US Patent Application Publication No. 20030222263.
Figure 3B:
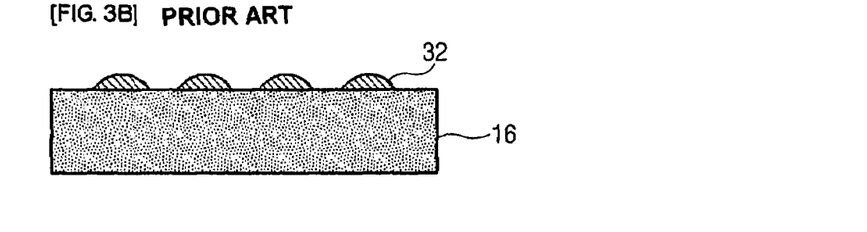
Figure 3C:
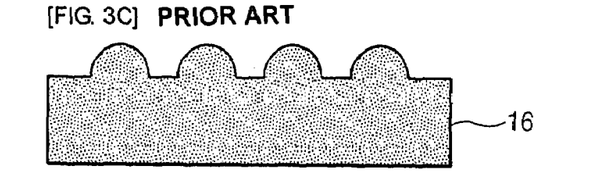
Figure 4:
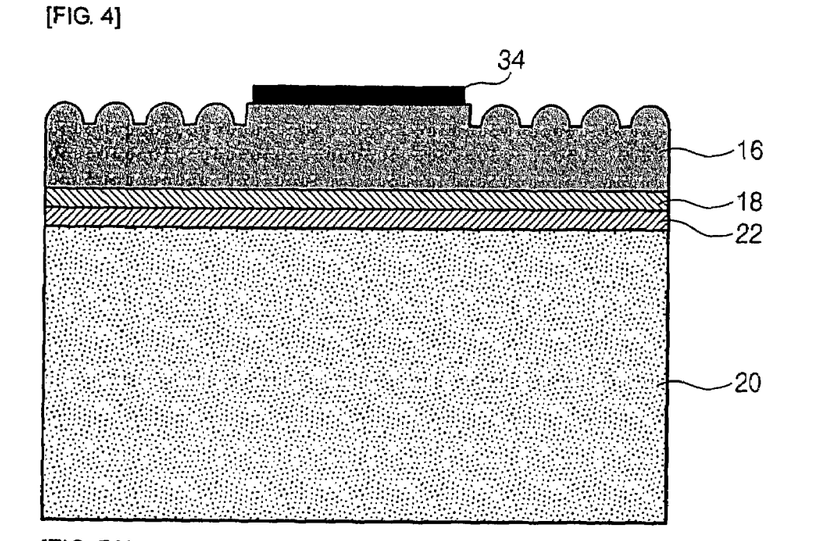
FIG. 4 is a cross-sectional view illustrating the vertically-structured GaN-based light emitting diode disclosed in US Patent Application Publication No. 20030222263.

FIGS. 2A to 2C are cross-sectional process views showing the vertically-structured GaN-based light emitting diode disclosed in US Patent Application Publication No. 20030222263. FIGS. 3A to 3C are enlarged cross-sectional process views illustrating the vertically-structured GaN-based light emitting diode. FIG. 4 is a cross-sectional view illustrating the vertically-structured GaN-based light emitting diode.

As shown in FIG. 2A, a light emitting diode structure 16 containing GaN and a p-type electrode 18 are formed on a sapphire substrate 24, and a first Pd layer 26 and an In layer 28 are then formed on the p-type electrode 18. Further, on the lower surface of a Si substrate 20, a second Pd layer 30 is formed.

As shown in FIG. 2B, the Si substrate 20 on which the second Pd layer 30 is formed is bonded onto the p-type electrode 18 on which the first Pd layer 26 and the In layer 28 are formed.

As shown in FIG. 2C, the sapphire substrate 24 is removed through an LLO process.

As shown in FIG. 3A, photoresist patterns 32 are formed on a predetermined portion of the surface (specifically, the surface of an n-type GaN layer) of the exposed light emitting diode structure 16, after the sapphire substrate 24 is removed.

As shown in FIG. 3B, the photoresist patterns 32 are formed in a hemispherical shape through a re-flow process.

As shown in FIG. 3C, the surface of the light emitting diode structure 16 is etched through an anisotropic etching method, so that the surface of the light emitting diode structure 16 is patterned in a hemispherical shape.

Finally, when the n-type electrode 34 is formed on the light emitting diode structure 16, the light emitting diode in which the surface of the light emitting diode structure 16 is patterned is completely manufactured as shown in FIG. 4.

However, in the light emitting diode manufactured according to the method of manufacturing the vertically-structured GaN-based light emitting diode disclosed in US Patent Application Publication No. 20030222263, when the light emitting diode structure 16 is grown on the sapphire substrate 24, threading dislocation occurs in the light emitting diode structure 16, due to a difference in the lattice constant and thermal expansion coefficient between the sapphire substrate 24 and the light emitting diode structure 16. The threading dislocation can be the cause of a defective light emitting diode.

Further, when the light emitting diode structure 16 with a thickness of less than 10 μm (in the case of ThinGaN) is handled, there are difficulties in an operation of patterning the photoresist and the following processes, even though a sub-support is used. Accordingly, the yield becomes very low.

In addition, since the patterns formed on the surface of the light emitting diode structure 16 are convex patterns with a hemispherical shape, the external emission path of the photons generated in the active layer is lengthened.

SUMMARY OF THE INVENTION

An advantage of the present invention is that it provides a vertically-structured GaN-based light emitting diode, in which the surface of a n-type GaN layer is patterned through a new process to increase external quantum efficiency and threading dislocation does not occur, and a method of manufacturing the same.

Additional aspects and advantages of the present general inventive concept will be set forth in part in the description which follows and, in part, will be obvious from the description, or may be learned by practice of the general inventive concept.

According to an aspect of the invention, a method of manufacturing a vertically-structured GaN-based light emitting diode includes forming a GaN layer on a substrate; patterning the compound layer in a predetermined shape; forming an n-type GaN layer on the patterned compound layer through the epitaxial lateral over-growth process and sequentially forming an active layer and a p-type GaN layer on the n-type GaN layer; forming a structure supporting layer on the p-type GaN layer; sequentially removing the substrate and the GaN layer formed on the substrate after forming the structure supporting layer; removing the patterned compound layer exposed after removing the GaN layer so as to form an n-type GaN layer patterned in a concave shape; and forming an n-type electrode on the n-type GaN layer patterned in a concave shape.

The method of manufacturing a vertically-structured GaN-based light emitting diode further includes forming a p-type electrode on the p-type GaN layer after forming the p-type GaN layer; and forming a p-type electrode on the structure supporting layer after forming the structure supporting layer.

The structure supporting layer is formed of any one selected from a group composed of a substrate and a plated layer.

The compound layer is formed of any one compound selected from a compound group composed of $SiO_2$ and $SiN_x$ (silicon-nitride type).

Patterning the compound layer includes forming a pattern layer patterned in a predetermined shape on the compound layer; and etching the compound layer by using the pattern layer as a mask.

Forming the pattern layer includes forming photoresist patterns with a predetermined shape on the compound layer; and reflowing the photoresist patterns so as to form photoresist patterns with a hemispheric shape.

In etching the compound layer, the re-flowed photoresist patterns and the compound layer are etched together, so that the compound layer is patterned in a hemispheric shape.

The hemispheric patterns are formed such that the height thereof ranges from 0.1 to 5 μm, the diameter thereof ranges from 0.5 to 5 μm, and the pattern period thereof ranges from 0.1 to 5 μm.

The method of manufacturing a vertically-structured GaN-based light emitting diode further includes removing the pattern layer after etching the compound layer.

Forming the n-type GaN layer includes forming an undoped GaN layer on the patterned compound layer; and forming a GaN layer doped with n-type impurities on the undoped GaN layer.

Forming the GaN layer doped with n-type impurities is performed by growing the GaN layer on the undoped GaN layer while gradually increasing the doping concentration of the n-type impurities.

The undoped GaN layer is formed to have a thickness of 0.1 to 1 μm.

According to another aspect of the invention, a vertically-structured GaN-based light emitting diode includes a structure supporting layer; a p-type electrode that is formed on the upper or lower surface of the structure supporting layer; a p-type GaN layer that is formed on the structure supporting layer on which the p-type electrode is formed; an active layer that is formed on the p-type GaN layer; an n-type GaN layer that is formed on the active layer and is doped with n-type impurities; an undoped GaN layer that is formed on the n-type GaN layer and on which a plurality of concave patterns are periodically formed; and an n-type electrode that is formed on the undoped GaN layer.

When the p-type electrode is formed on the lower surface of the structure supporting layer, the structure supporting layer is formed of any one selected from a group composed of a conductive substrate and a plated layer, and when the p-type electrode is formed on the upper surface of the structure supporting layer, the structure supporting layer is formed of any one selected from a group composed of a silicon substrate and a plated layer.

The concave patterns with a hemispheric shape are formed so that the depth thereof ranges from 0.1 to 5 μm, the diameter thereof ranges from 0.5 to 5 μm, and the pattern period thereof ranges from 0.5 to 5 μm.

The thickness of the undoped GaN layer ranges from 0.1 to 1 μm.

The vertically-structured GaN-based light emitting diode further includes a transparent conducting oxide (TCO) layer that is formed on the undoped GaN layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

Embodiment

FIGS. 5A to 5J are cross-sectional and plan views for explaining the respective steps of a method of manufacturing a vertically-structured GaN-based light emitting diode according to an embodiment of the present invention.

Figure 5A:
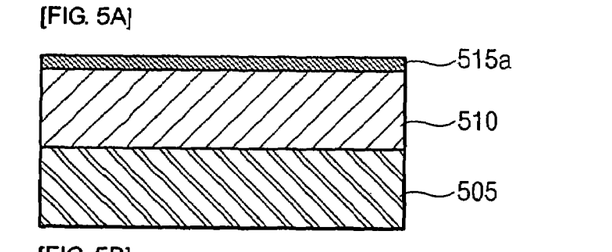
FIGS. 5A to 5J are cross-sectional views and perspective views for explaining a method of manufacturing a vertically-structured GaN-based light emitting diode according to an embodiment of the present invention.

First, as shown in FIG. 5A, a first GaN layer 510 is grown on a substrate 505. The first GaN layer 510 is an undoped GaN layer which is not doped with an impurity, and is grown at a rate of 1 μm per hour for 0.5 to 1.5 hour.

In the present embodiment, a sapphire substrate is used as the substrate 505.

On the first GaN layer 501, a compound layer 515a for performing an epitaxial lateral over-growth (hereinafter, referred to as 'ELOG') process is formed. In the ELOG process, the yield is the greatest, when the process is carried out on the basis of $SiO_2$ or $SiN_x$ (silicon nitride-based) compound. Therefore, the compound layer 515a is, preferably, a $SiO_2$ or $SiN_x$ (silicon nitride-based) compound.

In the present embodiment, a $SiO_2$ layer 515a as the compound layer 515a is formed by using a chemical vapor deposition (CVD) method or sputtering method.

Figure 5B:
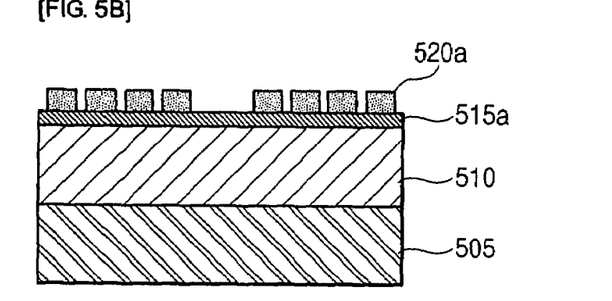

On the $SiO_2$ layer 515a, photoreactive polymer is coated by a thickness of 1 to 5 μm through a photolithography process, as shown in FIG. 5B. Then, the photoreactive polymer is patterned in a predetermined shape at a distance of 0.5 to 5 μm by using photoreaction and a mask, thereby forming photoresist patterns 520a. In this case, the photoresist patterns 520a may not be formed on a predetermined portion of the $SiO_2$ layer 515a, in consideration of a portion in which an n-type electrode should be formed in a process to be described below.

In the present embodiment, the photoreactive polymer is patterned by using a lattice-shaped mask, so that patterns having a rectangular parallelepiped shape are formed at a distance of 0.5 to 5 μm.

Figure 5C:
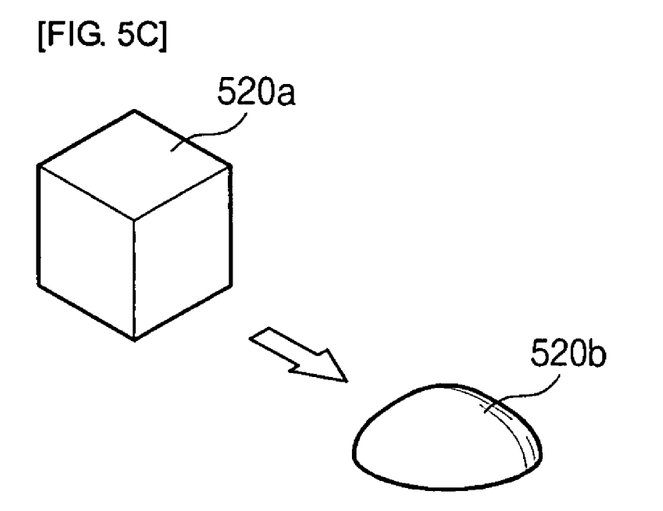

As shown in FIG. 5C, the photoresist patterns 520a with a rectangular parallelepiped shape are re-flowed at a temperature of 100 to 150° C. for one to five minutes, thereby forming photoresist patterns 520b with a hemispheric shape.

Figure 5D:
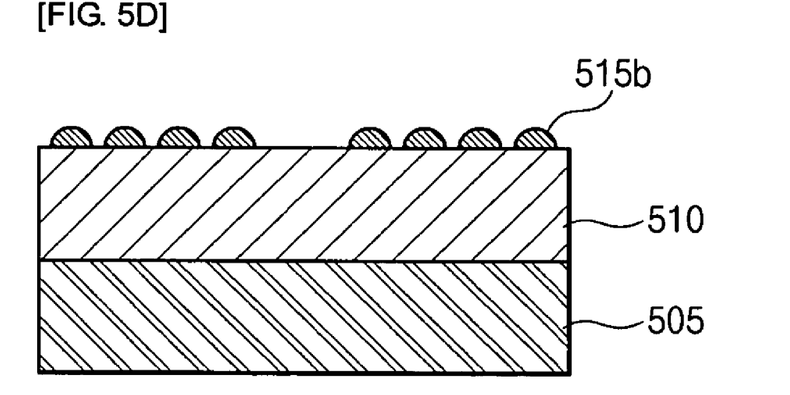
Figure 5E:
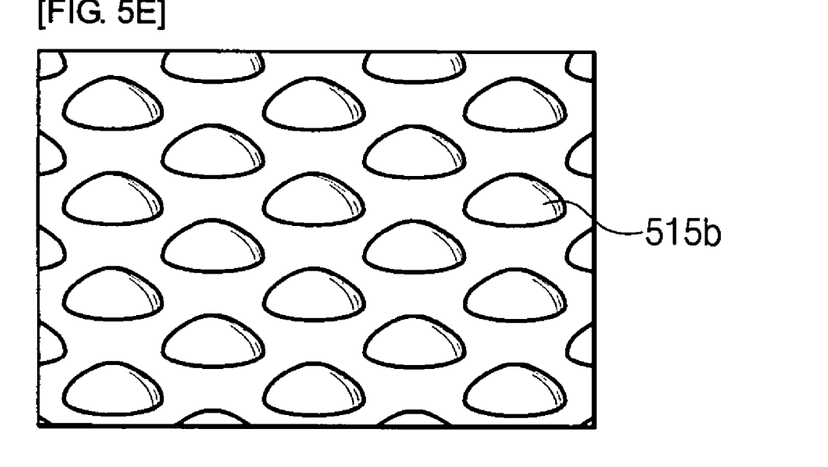

Next, the $SiO_2$ layer 515a is etched by using the photoresist patterns 520b with a hemispheric shape as a mask. At this time, the etching is carried out with a $BCl_3$ and HBr gas by using an ICP-RIE equipment, so that the photoresist patterns 520b with a hemispheric shape and the $SiO_2$ layer 515a are etched together. As a result, the $SiO_2$ layer 515a is etched into hemispheric patterns 515b, as shown in FIG. 5D. FIG. 5E is a perspective view showing a state where the $SiO_2$ layer 515a is etched into the hemispheric patterns 515b.

In the $SiO_2$ layer 515b etched into the hemispheric patterns, it is preferable that the height of the hemispheric patterns ranges from 0.1 to 5 μm, the diameter thereof ranges from 0.1 to 5 μm, and the pattern period thereof ranges from 0.1 to 5 μm. That is because, when the hemispheric patterns are formed out of the range of the defined numerical values, the surface of the n-type GaN layer is patterned so as to correspond to the hemispheric patterns, and it is difficult to expect the improvement of external quantum efficiency on the surface of the n-type GaN layer patterned in such a manner.

Figure 5F:
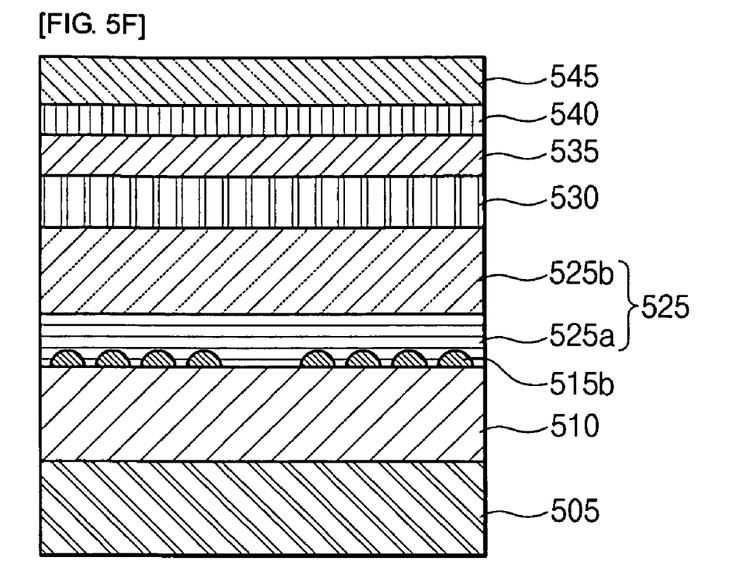

On the $SiO_2$ layer 515b patterned in a hemispheric shape, an n-type second GaN layer 525 is formed through the ELOG process, as shown in FIG. 5F.

Through the ELOG process, it is possible to form the n-type second GaN layer 525 with a high quality in which threading dislocation does not occur.

On the other hand, the n-type second GaN layer 525 can be formed of one layer. However, in order to prevent a current crowding effect in which a current flows in only the center of a diode, the n-type second GaN layer 525 may be formed of two layers, thereby enhancing a current-spreading effect.

In other words, on the $SiO_2$ layer 515b patterned in a hemispheric shape, the undoped GaN layer 525a which is not doped with n-type impurities is formed to have a predetermined thickness through the ELOG process. Then, on the undoped GaN layer 525a, the n-type GaN layer 525b doped with n-type impurities is formed. Since the undoped GaN layer 525a has higher resistance than the GaN layer 525b doped with n-type impurities, the undoped GaN layer 525a serves as a current-blocking film so that an electric current can spread to the overall diode.

Here, when the thickness of the undoped GaN layer 525a is less than 0.1 μm, it is difficult to generate a current-spreading effect. When the thickness exceeds 1 μm, an amount of current flowing in the diode can be extremely reduced. Therefore, the thickness of the undoped GaN layer 525a is, preferably, in the range of 0.1 to 1 μm.

When the GaN layer 525b doped with n-type impurities is formed, it is better to gradually increase the doping concentration of n-type impurities from a portion where the GaN layer 525b comes in contact with the undoped GaN layer 525a than to constantly maintain the doping concentration. The GaN layer 525b grown in such a manner can further enhance a current-spreading effect.

On the n-type second GaN layer 525, an active layer 530 and a p-type third GaN layer 535 are sequentially formed.

On the p-type third GaN layer 535, a p-type electrode 540 is formed. In this case, the p-type electrode 540 can be formed on a structure supporting layer 545, as will be described below.

On the p-type electrode 540, the structure supporting layer 545 is formed. Particularly, when the structure supporting layer 545 is a substrate (for example, a silicon substrate), a forming method thereof is as follows. First, a metal eutectic bonding layer (not shown) is formed on the p-type electrode 540. The metal eutectic bonding layer is formed in order to bond a silicon substrate through an eutectic bonding method, and is a metallic alloy layer composed of a first metal layer and second metal layer. The metallic alloy layer is deposited by using metal such as lead (Pb), phosphorus (In), gold-tin (AuSn), tin (Sn), gold (Au) or the like. Then, after a predetermined pressure and temperature is applied to the metal eutectic bonding layer, the silicon substrate is bonded to the metal eutectic bonding layer.

In case, the structure supporting layer 545 can be a plated layer which is formed by using a electroplating method, and can be formed by bonding a metal substrate through the eutectic bonding method.

The structure supporting layer 545 serves to prevent a light emitting diode from being damaged by an external impact which can be caused in a manufacturing process of the light emitting diode and in the final packaging process of the light emitting diode, so that the shape of the diode can be maintained.

On the other hand, in case where the p-type electrode 540 is not formed on the p-type third GaN layer 535, the p-type electrode 540 is formed on the structure supporting layer 545 in the present step. The structure supporting layer 545 should be formed of a conductive material (for example, a conductive substrate or plated layer) such as metal, in order to conduct an electric current.

Figure 5G:
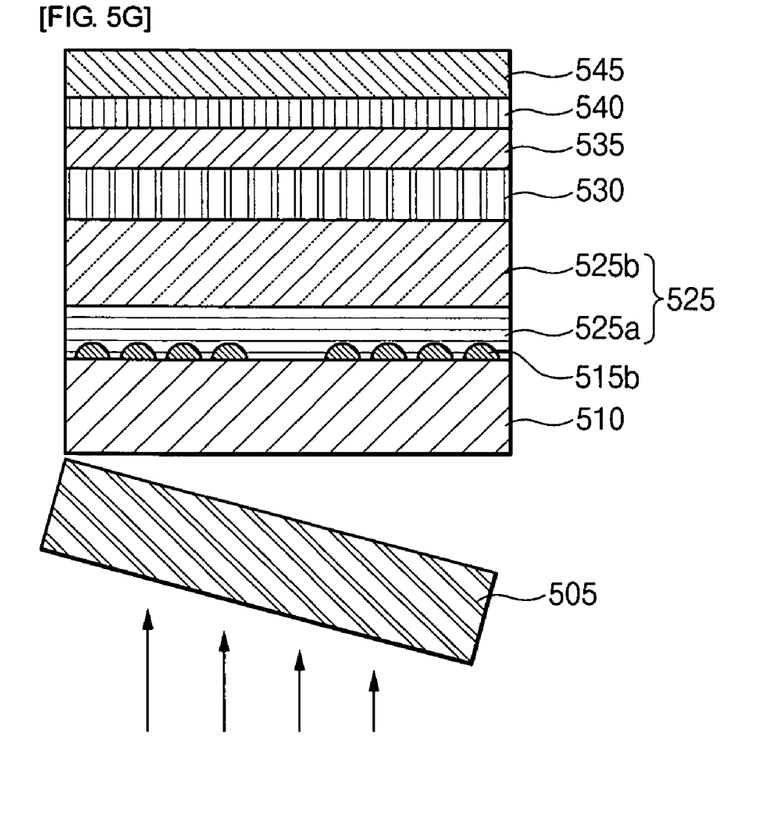

As shown in FIG. 5G, the sapphire substrate 505 is removed through an LLO process.

Figure 5H:
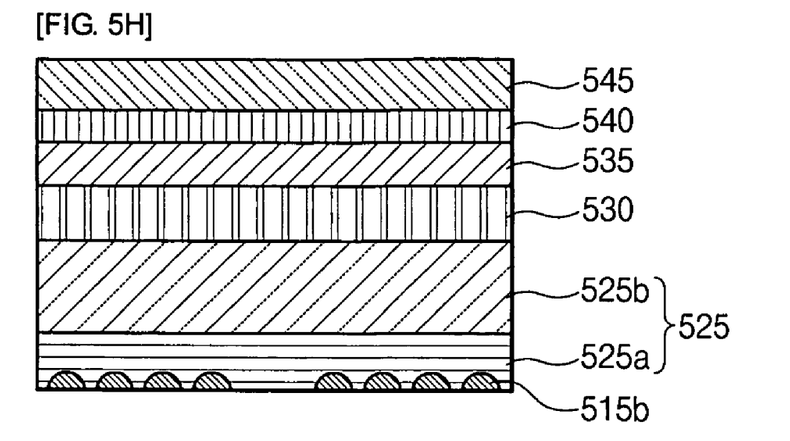

As shown in FIG. 5H, the first GaN layer 510 is completely removed by using an ICP-RIE equipment to thereby expose the hemispherically-patterned SiO$_2$ layer 515b.

Figure 5I:
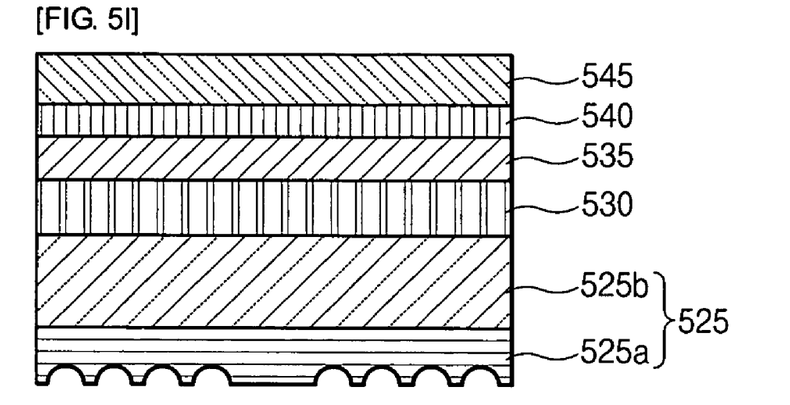

As shown in FIG. 5I, the exposed SiO$_2$ layer 515b is removed by using BHF (buffered hydrofluoric acid) to thereby form the n-type second GaN layer surface having hemispherical concave patterns.

Figure 5J:
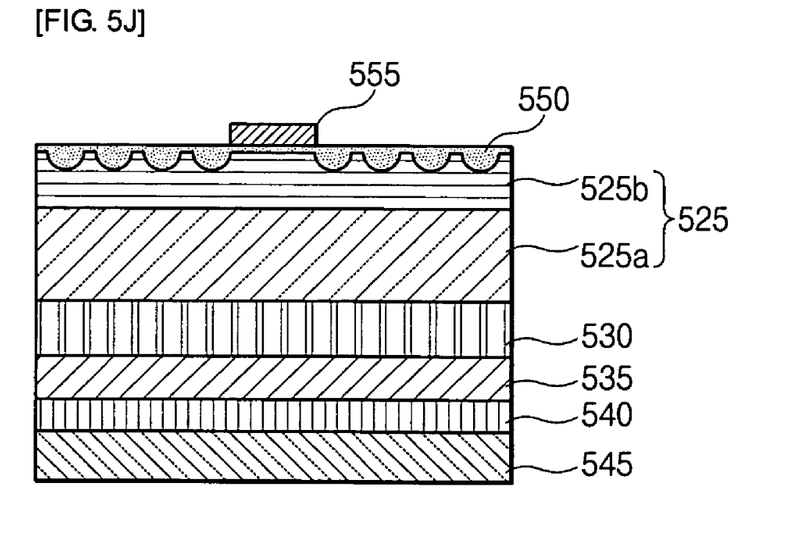

As shown in FIG. 5J, a transparent conducting oxide (TCO) layer 550 can be selectively formed on the patterned n-type second GaN layer 525, in order to enhance a current-spreading effect.

Finally, an n-type electrode 555 is formed on the n-type second GaN layer 525 on which the transparent conducting oxide layer 550 is formed, and a diode separation process is performed, thereby completing the manufacture of the light emitting diode according to the present embodiment.

FIG. 5J is a cross-sectional view illustrating the light emitting diode device manufactured according to the present embodiment. In the light emitting diode device, the hemispherical concave patterns are formed on the n-type second GaN layer 525. When the photons generated in the active layer 530 are incident on the hemispheric concave patterns formed on the n-type second GaN layer 525, it becomes highly likely that the incident angle is less than a critical angle. As a result, the external quantum efficiency of the overall light emitting diode increases.

Modified Embodiment

FIGS. 6A to 6E are cross-sectional views for explaining a method of manufacturing a vertically-structured GaN-based light emitting diode according to a modified embodiment of the above-described embodiment.

Figure 6A:
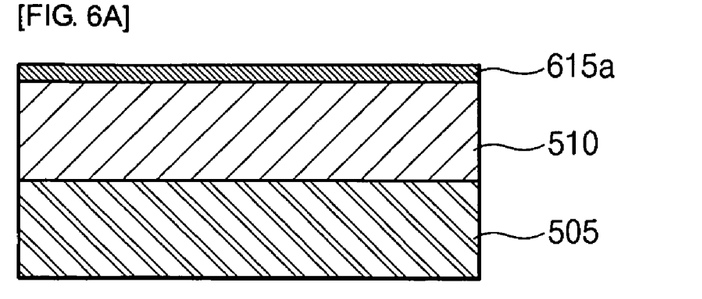
FIGS. 6A to 6E are cross-sectional views for explaining a method of manufacturing the vertically-structured GaN-based light emitting diode according to a modified embodiment of the invention.

First, as shown in FIG. 6A, a SiO$_2$ layer 615a is formed in the same manner as the above-described embodiment.

Figure 6B:
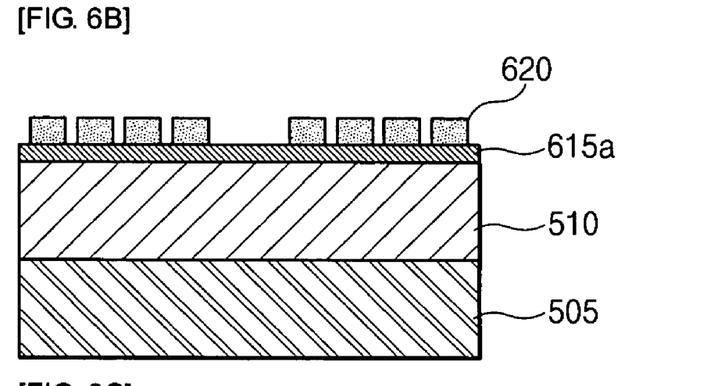

On the SiO$_2$ layer 615a, photoreactive polymer is coated by a thickness of 1 to 5 μm through a photolithography process, as shown in FIG. 6B. Then, the photoreactive polymer is patterned by using photoreaction and a mask, so that photoresist patterns 620 with a predetermined shape are formed at a distance of 0.5 to 5 μm.

In the present modified embodiment, the photoreactive polymer is patterned by using a lattice-shaped mask, so that patterns having a rectangular parallelepiped shape are formed at a distance of 0.5 to 5 μm, as shown in FIG. 6B.

Figure 6C:
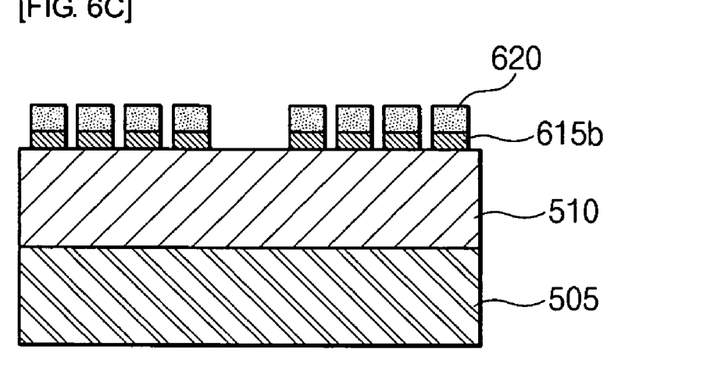

As shown in FIG. 6C, the SiO$_2$ layer 615a is etched by using the photoresist patterns 620a with a rectangular parallelepiped shape as a mask, thereby forming the patterned SiO$_2$ layer 615b. At this time, different from the above-described embodiment, only the SiO$_2$ layer 615a is etched by using the photoresist patterns 620 with a rectangular parallelepiped as a mask.

Figure 6D:
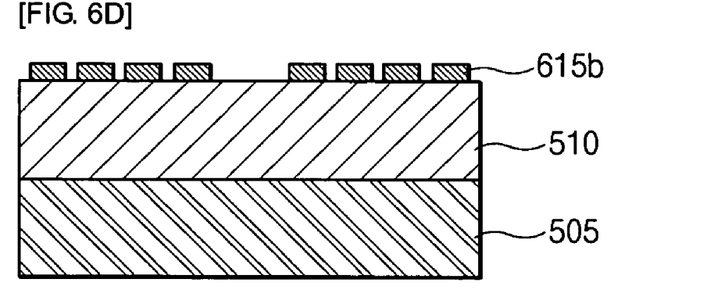

Next, as shown in FIG. 6D, the photoresist patterns 620 are removed by using acetone or the like.

Figure 6E:
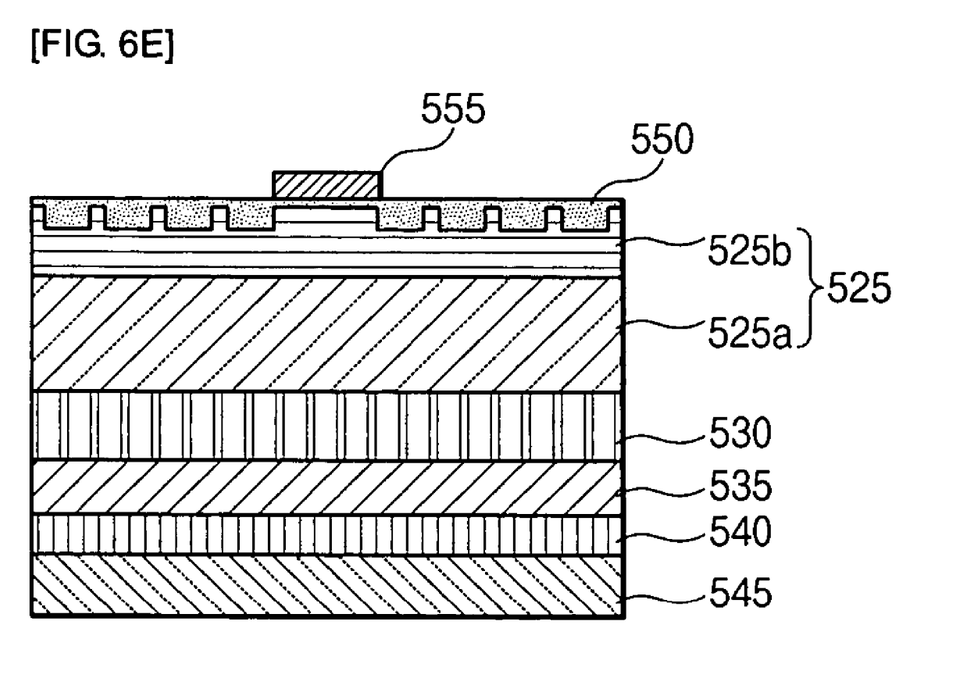

After that, the same processes as those of the above-described embodiment are carried out (for example, the ELOG process is performed on the patterned SiO$_2$ layer 615b), thereby completing the manufacture of the light emitting diode according to the present modified embodiment.

FIG. 6E is a cross-sectional view illustrating the light emitting diode manufactured according to the present modified embodiment. In the light emitting diode device, the concave patterns with a rectangular parallelepiped shape are formed on the n-type second GaN layer. Such a construction increases the external quantum efficiency of the overall light emitting diode.

In the embodiment and the modified embodiment, the n-type second GaN layer surface having the patterns with a hemispheric shape or rectangular parallelepiped shape is formed for the sake of convenience of description. However, by variously changing the photoresist patterns, it is possible to form the n-type second GaN layer surface with a variety of patterns.

According to the vertically-structured GaN-based light emitting diode and the method of manufacturing the same, threading dislocation does not occur when the structure of the light emitting diode device is formed, and a process in which the concave patterns are easily formed on the surface of the n-type GaN layer is carried out, which makes it possible to manufacture a light emitting diode device of which the yield and external quantum efficiency is excellent.

Further, the concave patterns are formed on the surface of the n-type GaN layer, so that the external emission path of the photons generated in the active layer can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a vertically-structured GaN-based light emitting diode comprising:
   forming a GaN layer on a substrate;
   forming a compound layer on the GaN layer in order to perform an epitaxial lateral over-growth (ELOG) process;
   patterning the compound layer in a predetermined shape;
   forming an n-type GaN layer on the patterned compound layer through the epitaxial lateral over-growth process and sequentially forming an active layer and a p-type GaN layer on the n-type GaN layer; forming a structure supporting layer on the p-type GaN layer;
   sequentially removing the substrate and the GaN layer formed on the substrate after forming the structure supporting layer;
   removing the patterned compound layer exposed after removing the GaN layer so as to form an n-type GaN layer patterned in a concave shape; and
   forming an n-type electrode on the n-type GaN layer patterned in a concave shape.

2. The method of manufacturing a vertically-structured GaN-based light emitting diode according to claim 1 further including forming a p-type electrode on the p-type GaN layer after forming the p-type GaN layer.

3. The method of manufacturing a vertically-structured GaN-based light emitting diode according to claim 1 further including forming a p-type electrode on the structure supporting layer after forming the structure supporting layer.

4. The method of manufacturing a vertically-structured GaN-based light emitting diode according to claim 1, wherein the structure supporting layer is formed of any one selected from a group composed of a substrate and a plated layer.

5. The method of manufacturing a vertically-structured GaN-based light emitting diode according to claim 1, wherein the compound layer is formed of any one compound selected from a compound group composed of $SiO_2$ and $SiN_x$ (silicon-nitride type).

6. The method of manufacturing a vertically-structured GaN-based light emitting diode according to claim 1, wherein patterning the compound layer includes:
 forming a pattern layer patterned in a predetermined shape on the compound layer; and etching the compound layer by using the pattern layer as a mask.

7. The method of manufacturing a vertically-structured GaN-based light emitting diode according to claim 6, wherein forming the pattern layer includes:
 forming photoresist patterns with a predetermined shape on the compound layer; and
 re-flowing the photoresist patterns so as to form photoresist patterns with a hemispheric shape.

8. The method of manufacturing a vertically-structured GaN-based light emitting diode according to claim 7, wherein, in etching the compound layer, the re-flowed photoresist patterns and the compound layer are etched together, so that the compound layer is patterned in a hemispheric shape.

9. The method of manufacturing a vertically-structured GaN-based light emitting diode according to claim 7 or 8, wherein the hemispheric patterns are formed such that the height thereof ranges from 0.1 to 5 μm, the diameter thereof ranges from 0.5 to 5 μm, and the pattern period thereof ranges from 0.1 to 5 μm.

10. The method of manufacturing a vertically-structured GaN-based light emitting diode according to claim 6 further including removing the pattern layer after etching the compound layer.

11. The method of manufacturing a vertically-structured GaN-based light emitting diode according to claim 1, wherein forming the n-type GaN layer includes:
 forming a undoped GaN layer on the patterned compound layer; and forming a GaN layer doped with n-type impurities on the undoped GaN layer.

12. The method of manufacturing a vertically-structured GaN-based light emitting diode according to claim 11, wherein forming the GaN layer doped with n-type impurities is performed by growing the GaN layer on the undoped GaN layer while gradually increasing the doping concentration of the n-type impurities.

13. The method of manufacturing a vertically-structured GaN-based light emitting diode according to claim 11, wherein the undoped GaN layer is formed to have a thickness of 0.1 to 1 μm.

* * * * *